United States Patent
Lee et al.

(10) Patent No.: US 7,825,750 B2
(45) Date of Patent: Nov. 2, 2010

(54) EMI FILTER FOR CONTROLLING CUTOFF FREQUENCY

(75) Inventors: Kye Nam Lee, Yongin-Si (KR); Young Jin Park, Seongnam-Si (KR); Jin Hyung Kim, Icheon-Si (KR); Hyun Kyu Yang, Yeongi-Gun (KR); Yoo Ran Kim, Gongju-Si (KR)

(73) Assignee: Petari Incorporation, Daejeon (KR)

( * ) Notice: Subject to any disclaimer, the term of this patent is extended or adjusted under 35 U.S.C. 154(b) by 513 days.

(21) Appl. No.: 11/768,912

(22) Filed: Jun. 27, 2007

(65) Prior Publication Data

US 2007/0296277 A1    Dec. 27, 2007

(30) Foreign Application Priority Data

Jun. 27, 2006   (KR) .................. 10-2006-0058029

(51) Int. Cl.
*H03H 7/01* (2006.01)
*H03H 7/06* (2006.01)

(52) U.S. Cl. .................. 333/194; 333/167; 333/172
(58) Field of Classification Search ............... 333/167, 333/172, 193, 194
See application file for complete search history.

(56) References Cited

U.S. PATENT DOCUMENTS

| | | | | | |
|---|---|---|---|---|---|
| 5,499,392 | A | * | 3/1996 | Grunwell | 455/260 |
| 5,541,558 | A | * | 7/1996 | Weber et al. | 333/174 |
| 5,559,479 | A | * | 9/1996 | Ohmori et al. | 331/177 V |
| 6,084,486 | A | * | 7/2000 | Suzuki et al. | 333/174 |
| 6,453,157 | B1 | * | 9/2002 | Roberts | 455/337 |
| 6,686,809 | B2 | * | 2/2004 | Nystrom et al. | 333/17.1 |

FOREIGN PATENT DOCUMENTS

| KR | 1020020042998 | 6/2002 |
|---|---|---|
| KR | 1020070013667 | 1/2007 |

* cited by examiner

*Primary Examiner*—Robert Pascal
*Assistant Examiner*—Kimberly E Glenn
(74) *Attorney, Agent, or Firm*—Horizon IP Pte Ltd

(57) ABSTRACT

Disclosed relates to an electromagnetic interference (EMI) filter. Capacitance and resistance or inductance of an EMI filter, which includes a resistor and a capacitor or an inductor and a capacitor, can be controlled, such that a cutoff frequency can be freely controlled without manufacturing a separate EMI filter according to a characteristic of a desired cutoff frequency. Further, an intelligent EMI filter that can be applied to a surge protection device, which includes an ESD protection function as well as the EMI filter, is provided, such that a process can be simplified and costs can be reduced.

18 Claims, 7 Drawing Sheets

EMI FILTER FOR CONTROLLING CUTOFF FREQUENCY

CROSS REFERENCE TO RELATED APPLICATION

This application claims priority from Korean Patent Application No. 10-2006-0058029 filed on Jun. 27, 2006, in the Korean Intellectual Property Office, the disclosure of which is incorporated herein by reference in its entirety.

BACKGROUND OF THE INVENTION

1. Field of the Invention

The present invention relates to an electromagnetic interference (EMI) filter, and more particularly, to an EMI filter that is capable of freely controlling a cutoff frequency.

2. Description of the Related Art

Communication and information apparatuses, automatic apparatuses, and the like include various kinds of electric/electronic circuits. Except for desired functions, when the electric/electronic circuits are installed adjacent to each other, the circuits electrically or electromagnetically interact with each other and undesirably affect each other. The undesirable effect is called Electromagnetic Interference (hereinafter, referred to as "EMI"). Moreover, as the circuits get closer to each other, the interference becomes more serious. Therefore, as the degree of integration of electric/electronic circuits becomes higher, an influence of EMI becomes more serious.

In general, an EMI filter that is implemented in an element device to reduce the EMI includes a resistor and a capacitor, or an inductor and a capacitor. Further, a cutoff frequency (Fc), which is a characteristic value of the EMI filter, is determined according to the resistance, the inductance, and the capacitance. Therefore, in order to manufacture an EMI filter which satisfies a requirement for specific cutoff frequency, circuits are formed by selecting discrete elements having appropriate resistance, inductance and capacitance respectively.

However, in order to satisfy various cutoff frequency characteristics, the resistance, the inductance, and the capacitance need to be controlled according to the individual requirements. And the filters have to be manufactured separately according to the predetermined cutoff frequency characteristics. As such, manufacturing costs are increased, since the filters need to be separately manufactured according to the required frequency characteristics.

SUMMARY OF THE INVENTION

Accordingly, the present invention is to provide an EMI filter that is capable of varying a cutoff frequency without manufacturing a new EMI filter even when a cutoff frequency requirement is changed.

The present invention is also to provide an EMI filter that is capable of varying a cutoff frequency by enabling control of the characteristic values of discrete elements that form the EMI filter.

Further, the present invention is to provide an EMI filter that can be applied to a composite surge protection device where a diode or a Zener diode, which is widely used as a surge protection element, is coupled.

According to an aspect of the invention, an EMI filter includes at least one of a resistor, a capacitor, an inductor and a combination thereof that are provided so as to pass frequencies of a frequency band lower than a cutoff frequency and not to pass frequencies of a frequency band higher than the cutoff frequency. The cutoff frequency herein is controlled by selectively controlling at least one of the resistance, the capacitance, the inductance and a combination thereof.

The EMI filter may further include a resistor that is connected in series between an input terminal and an output terminal, and a capacitance control unit that is connected in parallel between the input terminal and the output terminal.

The EMI filter may further include an inductor that is connected in series between the input terminal and the output terminal, and a capacitance control unit that is connected in parallel between the input terminal and the output terminal.

The capacitance control unit may include diodes that are connected in parallel between the input terminal and the output terminal, and a voltage source that applies a reverse voltage to the diodes. A junction capacitance of the diodes changes according to the voltage source so that capacitance of the EMI filter is controlled.

The capacitance control unit may include an MOS capacitor that is connected in parallel between the input terminal and the output terminal, and a voltage source that applies a voltage to a gate terminal of the MOS capacitor. A junction capacitance of the MOS capacitor changes according to the voltage source so that the capacitance of the EMI filter is controlled.

The diodes may include at least two diodes that are connected back-to-back.

The EMI filter may further include a capacitor that is connected in parallel between the input terminal and the output terminal, and an ESD protection circuit that is provided between the input terminal and the output terminal.

The ESD protection circuit may include diodes that are connected in parallel, and the diodes may include at least two diodes that are connected back-to-back.

BRIEF DESCRIPTION OF THE DRAWINGS

The above and other features and advantages of the present invention will become more apparent by describing in detail preferred embodiments thereof with reference to the attached drawings in which.

DESCRIPTION OF THE PREFERRED EMBODIMENTS

Hereinafter, embodiments of the invention will be described in detail with reference to the accompanying drawings. The invention may, however, be embodied in many different forms and should not be construed as being limited to the embodiments set forth herein. Rather, these embodiments are provided such that this disclosure will be thorough and complete and will fully convey the concept of the invention to those skilled in the art.

Figure 1:
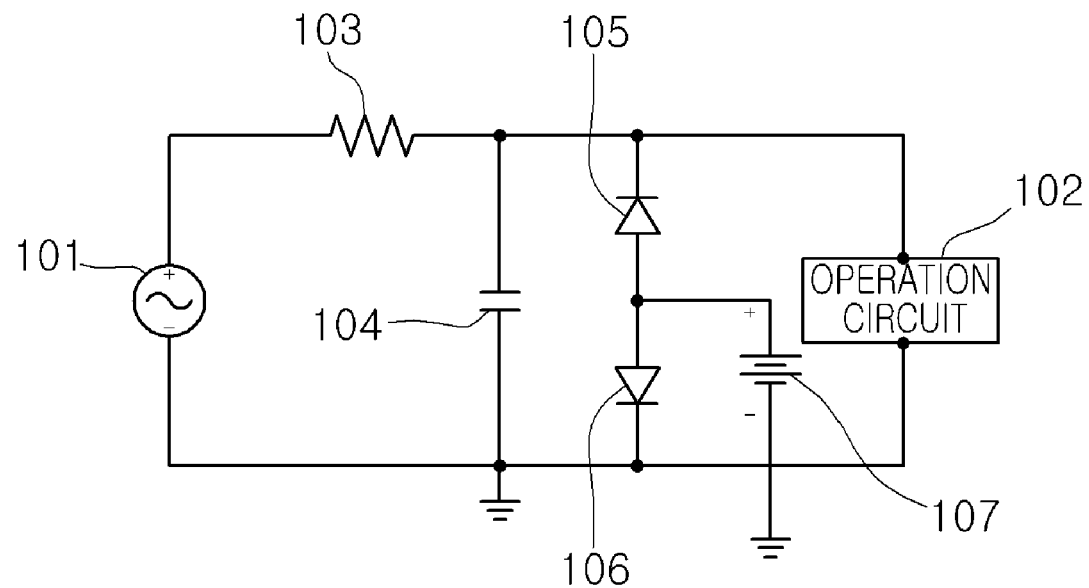
FIG. 1 is a circuit diagram illustrating an EMI filter according to a first embodiment of the present invention.

FIG. 1 is a circuit diagram illustrating a structure of an EMI filter according to a first embodiment of the present invention.

Referring to FIG. 1, a resistor 103 is connected in series between an input terminal and an output terminal of an EMI filter, for example, between a first power source 101 and an operation circuit 102, and a capacitor 104 is connected in parallel therebetween. Further, first and second diodes 105 and 106 are connected in parallel between the first power source 101 and the operation circuit 102. The first and second diodes 105 and 106 are connected back-to-back with the same electrodes of the two diodes facing each other. Further, any type of diodes including Zener diodes can be used as the first and second diodes 105 and 106. A second power source 107 is connected to the first and second diodes 105 and 106, such that a voltage is applied in a reverse direction to the first and second diodes 105 and 106. Here, the first power source 101 is an alternating current (AC) power source, and the second power source 107 is a direct current (DC) power source.

The above-described EMI filter passes frequencies of a frequency band lower than a cutoff frequency, but does not pass those higher than the cutoff frequency. In the above-described structure, when a voltage from the second power source 107 is applied in a reverse direction to the first and second diodes 105 and 106, a junction capacitance in the first and second diodes 105 and 106 changes. The amount of change in the junction capacitance is in proportion to an external voltage being applied, that is, the voltage of the second power source 107. Therefore, the junction capacitance in the diodes can be controlled by controlling the second power source 107, such that the capacitance of the entire filter can be controlled. This means that the cutoff frequency of the EMI filter can be controlled from the outside. Meanwhile, when the junction capacitance of the first and second diodes 105 and 106 has sufficient capacitance required by the filter, the capacitor 104 does not need to be connected.

The description has been made of the example in which the EMI filter is connected between the first power source 101 and the operation circuit 102. However, the present invention is not limited thereto. In order to reduce EMI, the EMI filter can be disposed in any circuit configuration. That is, the EMI filter can be connected between electric/electronic circuits that are installed adjacent to each other and affected by the EMI.

Figure 2:
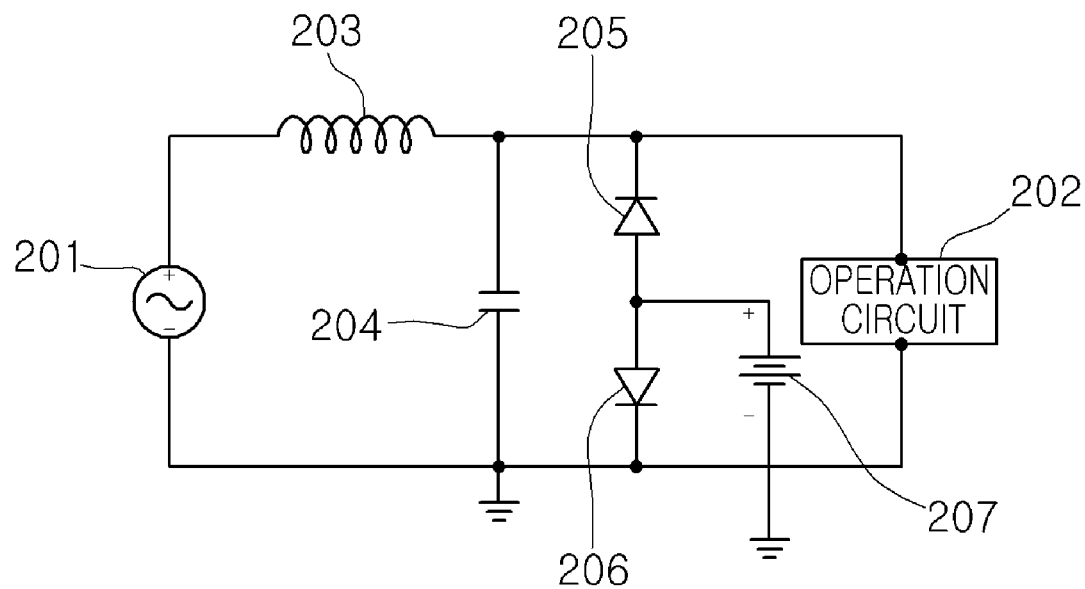
FIG. 2 is a circuit diagram illustrating an EMI filter according to a second embodiment of the present invention.

FIG. 2 is a circuit diagram illustrating a structure of an EMI filter according to a second embodiment of the present invention.

Referring to FIG. 2, an inductor 203 is connected in series between an input terminal and an output terminal of an EMI filter, for example, between a first power source 201 and an operation circuit 202, and a capacitor 204 is connected in parallel therebetween. Further, first and second diodes 205 and 206 are connected in parallel between the first power source 201 and the operation circuit 202. The first and second diodes 205 and 206 are connected back-to-back with the same electrodes of the two diodes facing each other. Further, any type of diodes including Zener diodes can be used as the first and second diodes 205 and 206. A second power source 207 is connected to the first and second diodes 205 and 206, such that a voltage is applied in a reverse direction to the first and second diodes 205 and 206. Here, the first power source 201 is an alternating current (AC) power source, and the second power source 207 is a direct current (DC) power supply.

The above-described EMI filter passes frequencies of a frequency band lower than a cutoff frequency but does not pass those higher than the cutoff frequency. In the above-described structure, when a voltage of the second power source 207 is applied to the first and second diodes 205 and 206, a junction capacitance in the diodes changes. The amount of change in the junction capacitance is in proportion to an external voltage being applied, that is, the voltage of the second power source 207. Therefore, the junction capacitance in the first and second diodes 205 and 206 can be controlled by controlling the second power source 207, such that capacitance of the entire filter can be controlled. This means that the cutoff frequency of the EMI filter can be controlled from the outside. Meanwhile, when the junction capacitance of the first and second diodes 205 and 206 has sufficient capacitance required by the filter, the capacitor 204 does not need to be connected.

The description has been made of the example in which the EMI filter is connected between the first power source 201 and the operation circuit 202. However, the present invention is not limited thereto. In order to reduce EMI, the EMI filter can be disposed in any circuit configuration. That is, the EMI filter can be connected between electric/electronic circuits that are installed adjacent to each other and affected by the EMI.

Figure 3A:
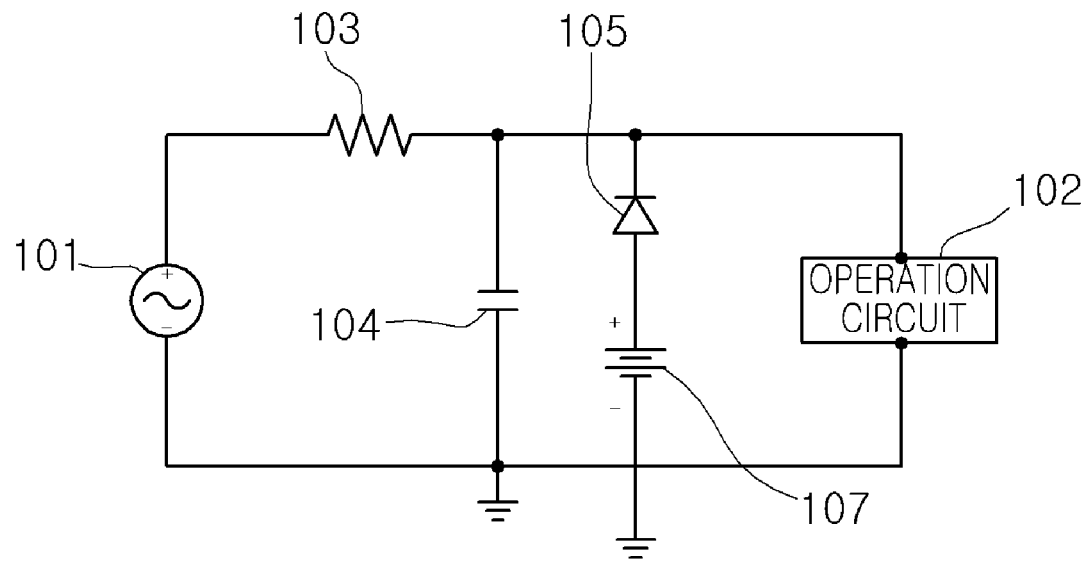
FIGS. 3A and 3B are circuit diagrams illustrating a first modification of the EMI filter according to the first and second embodiments of the present invention, respectively.
Figure 3B:
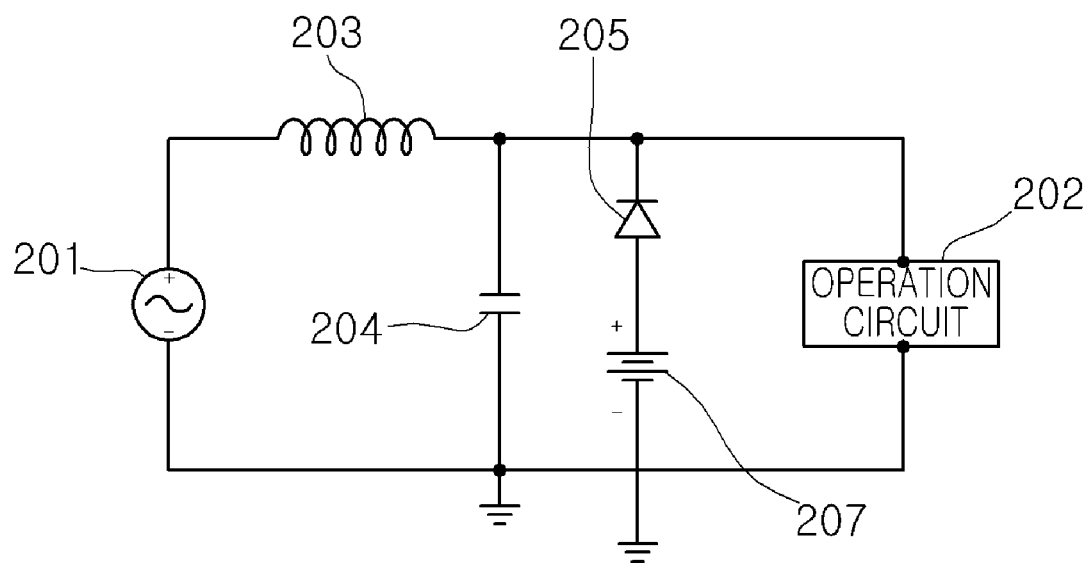

FIGS. 3A and 3B are circuit diagrams illustrating a first modification of the EMI filter according to the first and second embodiments of the present invention, respectively. In FIGS. 3A and 3B, an EMI filter is provided, in which only one diode is connected instead of two diodes connected back-to-back, which are applied to the EMI filter.

As shown in FIG. 3A, a resistor 103 is connected in series between an input terminal and an output terminal of the EMI filter, for example, between a first power source 101 and an operation circuit 102, and a capacitor 104 is connected in parallel therebetween. Further, a diode 105 is connected in parallel between the first power source 101 and the operation circuit 102. A second power source 107 is connected to the diode 105, such that a reverse voltage is applied. Here, since a junction capacitance in the diode 105 changes according to a voltage of the second power source 107, it is possible to control the cutoff frequency of the EMI filter. Here, the first power source 101 is an alternating current (AC) power source, and the second power source 107 is a direct current (DC) power source.

Referring to FIG. 3B, an inductor 203 is connected in series between an input terminal and an output terminal of the EMI filter, for example, between a first power source 201 and an operation circuit 202, and a capacitor 204 is connected in parallel therebetween. Further, a diode 205 is connected in parallel between the first power source 201 and the operation circuit 202. Further, a second power source 207 is connected to the diode 205, such that a reverse voltage is applied. Here, the first power source 201 is an alternating current (AC) power source, and a second power source 207 is a direct current (DC) power source.

Figure 4A:
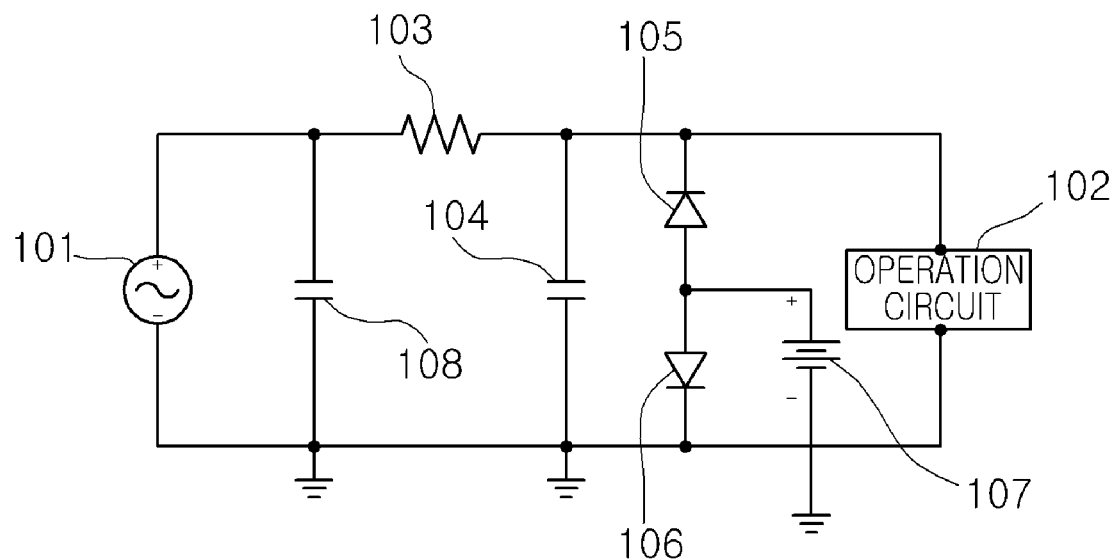
FIGS. 4A and 4B are circuit diagrams illustrating a second modification of the EMI filter according to the first and second embodiments of the present invention, respectively.
Figure 4B:
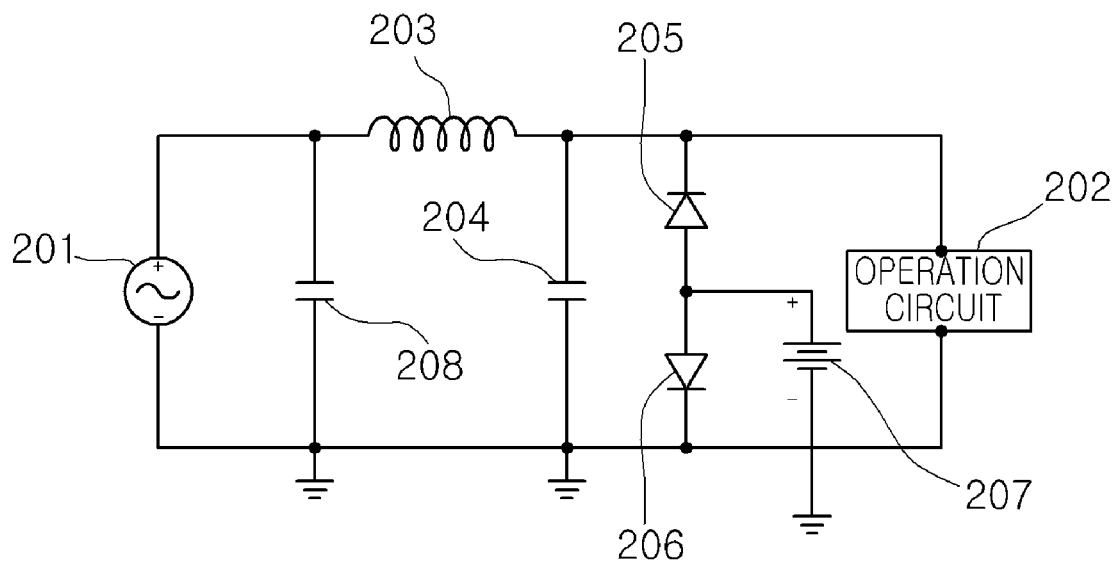

FIGS. 4A and 4B are circuit diagrams illustrating a second modification of the EMI filter according to the first and second embodiments of the present invention. In FIGS. 4A and 4B, a π-type EMI filter that includes capacitors connected to both ends of a resistor or an inductor is provided. That is, a π-type EMI filter that includes a resistor or an inductor, and two capacitors is provided.

Referring to FIG. 4A, a resistor 103 is connected in series between an input terminal and an output terminal of the EMI filter, for example, between a first power source 101 and an operation circuit 102. And a first and a second capacitors 104 and 108 are connected in parallel therebetween. Here, the first capacitor 104 is connected in parallel between the resistor 103 and the operation circuit 102, and the second capacitor 108 is connected in parallel between the first power source 101 and the resistor 103. Further, first and second diodes 105 and 106 are connected in parallel between the first power source 101 and the operation circuit 102. The first and second diodes 105 and 106 are connected back-to-back. Further, a second power source 107 is connected to the first and second diodes 105 and 106, such that a reverse voltage is applied to the first and second diodes 105 and 106. Here, the first power source 101 is an alternating current (AC) power source, and the second power source 107 is a direct current (DC) power source.

Referring to FIG. 4B, an inductor 203 is connected in series between an input terminal and an output terminal of the EMI filter, for example, between the first power source 201 and the operation circuit 202. And a first and a second capacitors 204 and 208 are connected in parallel therebetween. Here, the first capacitor 204 is connected in parallel between the resistor 203 and the operation circuit 202, and the second capacitor 208 is connected in parallel between the first power source 201 and the inductor 203. Further, the first and second diodes 205 and 206 are connected in parallel between the first power source 201 and the operation circuit 202. The first and second diodes 205 and 206 are connected back-to-back. A second power source 207 is connected to the first and second diodes 205 and 206, such that a reverse voltage is applied to the first and second diodes 205 and 206. Here, the first power source 201 is an alternating current (AC) power source, and the second power source 207 is a direct current (DC) power source.

Meanwhile, the description has been made of the example in which two capacitors are connected. However, the present invention is not limited thereto. A plurality of resistors, inductors, and capacitors can be connected, and one diode can be formed instead of two diodes connected back-to-back as described above.

Figure 5A:
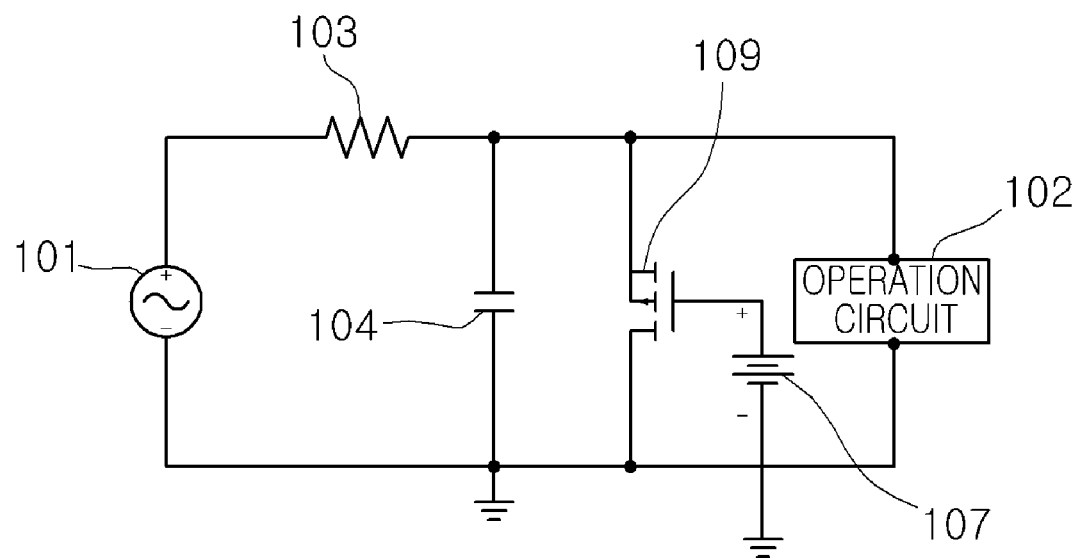
FIGS. 5A and 5B are circuit diagrams illustrating a third modification of the EMI filter according to the first and second embodiments of the present invention, respectively.
Figure 5B:
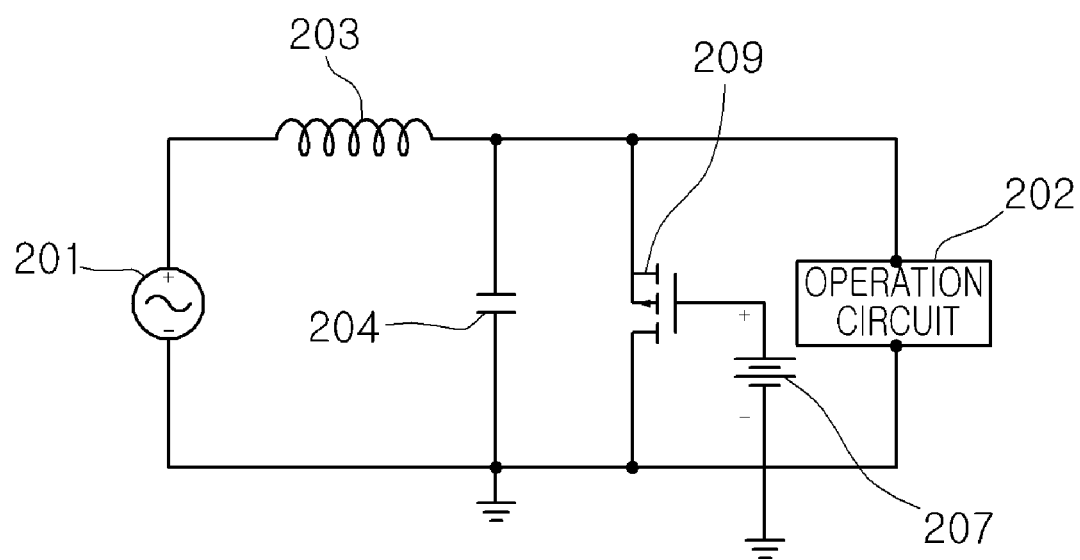

FIGS. 5A and 5B are circuit diagrams illustrating a third modification of the EMI filter according to the first and second embodiments of the present invention. In FIGS. 5A and 5B, an EMI filter that includes a variable MOS capacitor, instead of the diodes, is provided. Further, all types of elements capable of varying capacitance can be applied. When the variable MOS capacitor is connected instead of the diodes, a change of a breakdown voltage of the diodes that occurs by applying a voltage to the diodes can be prevented.

Referring to FIG. 5A, an inductor 103 is connected in series between an input terminal and an output terminal of the EMI filter, for example, between a first power source 101 and an operation circuit 102. And a capacitor 104 is connected in parallel therebetween. Further, a variable MOS capacitor 109 is connected in parallel between the first power source 101 and the operation circuit 102. Further, a second power source 107 is connected to a gate terminal of the MOS capacitor 109. Here, the first power source 101 is an alternating current (AC) power source, and the second power source 107 is a direct current (DC) power source.

Referring to FIG. 5B, a resistor 203 is connected in series between an input terminal and an output terminal of the EMI filter, for example, between a first power source 201 and an operation circuit 202. And a capacitor 204 is connected in parallel therebetween. Further, a variable MOS capacitor 209 is connected in parallel between the first power source 201 and the operation circuit 202. Further, a second power source 207 is connected to a gate terminal of the MOS capacitor 209. Here, the first power source 201 is an alternating current (AC) power source, and the second power source 207 is a direct current (DC) power source.

When a voltage is applied to the gate terminal of the MOS capacitor 109 or 209, electrons that gather at a semiconductor substrate of the MOS capacitor 109 or 209 are accumulated or depleted, such that capacitance of the MOS capacitor 109 or 209 is controlled.

Figure 6A:
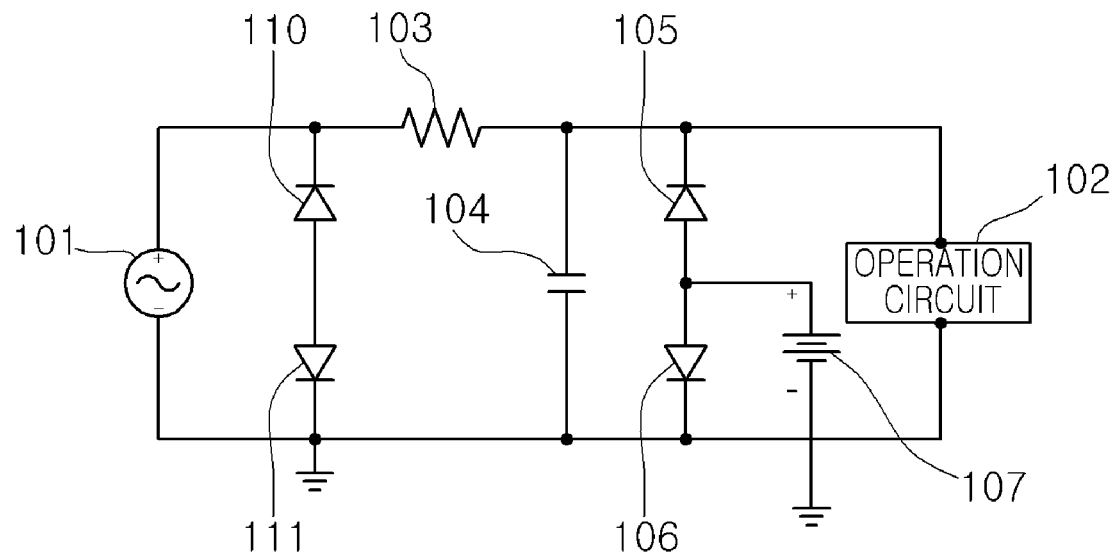
FIGS. 6A and 6B are circuit diagrams illustrating a fourth modification of the EMI filter according to the first and second embodiments of the present invention, respectively.
Figure 6B:
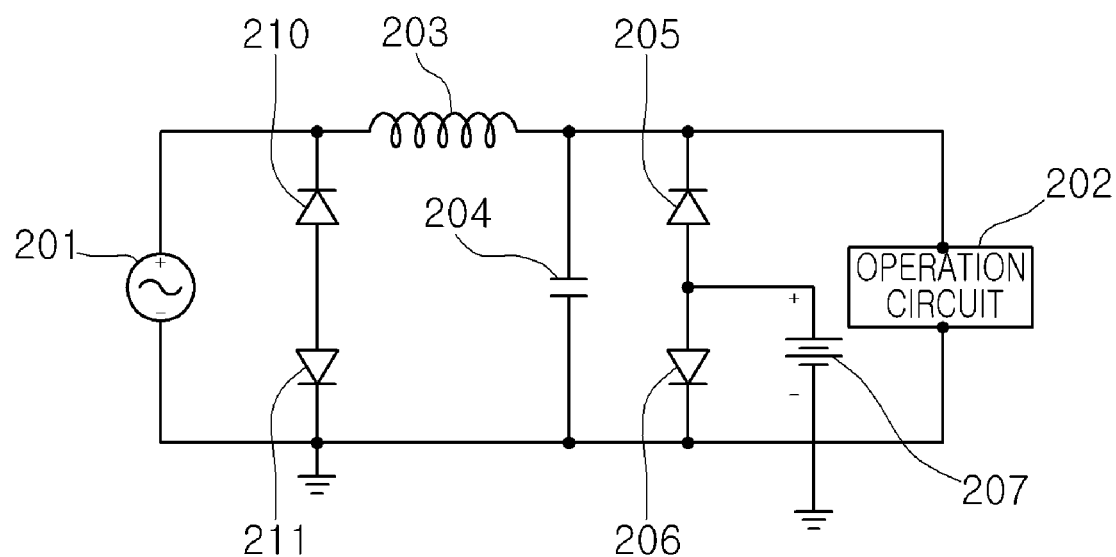

FIGS. 6A and 6B are circuit diagrams illustrating a fourth modification of the EMI filter according to the first and second embodiments of the present invention. FIGS. 6A and 6B are circuit diagrams of a surge protection EMI filter, in which an electrostatic discharge (ESD) protection circuit is further applied to the EMI filter. In this embodiment, back-to-back diodes are connected so as to bypass an input of a high voltage such as ESD of a signal input terminal.

Referring to FIG. 6A, a resistor 103 is connected in series between an input terminal and an output terminal of the EMI filter, for example, between a first power source 101 and an operation circuit 102. And a capacitor 104 is connected in parallel therebetween. Further, first and second diodes 105 and 106 are connected in parallel between the first power source 101 and the operation circuit 102. Here, the first and second diodes 105 and 106 are connected back-to-back. Further, a second power source 107 is connected to the first and second diodes 105 and 106, such that a reverse voltage is applied to the first and second diodes 105 and 106. Here, the first power source 101 is an alternating current (AC) power source, and the second power source 107 is a direct current (DC) power source. Further, third and fourth diodes 110 and 111 are connected in parallel between the first power source 101 and the resistor 103, and the third and fourth diodes 110 and 111 are connected back-to-back. Here, the third and fourth diodes 110 and 111 that are connected back-to-back bypass an input of a high voltage such as ESD of a signal input terminal.

Referring to FIG. 6B, an inductor 203 is connected in series between an input terminal and an output terminal of the EMI filter, for example, between a first power source 201 and an operation circuit 202. And a capacitor 204 is connected in parallel therebetween. Further, first and second diodes 205 and 206 are connected in parallel between the first power source 201 and the operation circuit 202. Here, the first and second diodes 205 and 206 are connected back-to-back. Further, a second power source 207 is connected to the first and second diodes 205 and 206, such that a reverse voltage is applied to the first and second diodes 205 and 206. Here, the first power source 201 is an alternating current (AC) power source, and the second power source 207 is a direct current (DC) power source. Further, third and fourth diodes 210 and 211 are connected in parallel between the first power source 201 and the inductor 203, and the third and fourth diodes 210 and 211 are connected back-to-back. Here, the third and fourth diodes 210 and 211 that are connected back-to-back bypass an input of a high voltage such as ESD of a signal input terminal.

The third diode 110 or 210 and the fourth diode 111 or 211 that are connected to the input terminal block an instantaneous high voltage or high current of the input terminal from the output terminal. That is, since the diodes bypass an input of a higher voltage than a breakdown voltage, when an unexpected voltage such as static electricity is input, the diodes bypass the voltage and protect the operation circuit against the high voltage.

Meanwhile, in the embodiment, a reverse voltage may be applied to the third diode 110 or 210, and the fourth diode 111 or 211 that are connected back-to-back, as in the case of the first diode 105 or and 205 and the second diode 106 or 206 that are also connected back-to-back. In this case, the third and fourth diodes can perform a capacitance control function and an ESD protection function. Likewise, since the first diode 105 or 205 and the second diode 106 or 206 connected back-to-back serve as a conductor at the higher voltage than the breakdown voltage, the first and second diodes can perform a capacitance control function and an ESD protection function. Further, when the capacitance covered by the plurality of diodes is sufficient, the capacitor 104 or 204 does not need to be connected.

Figure 7A:
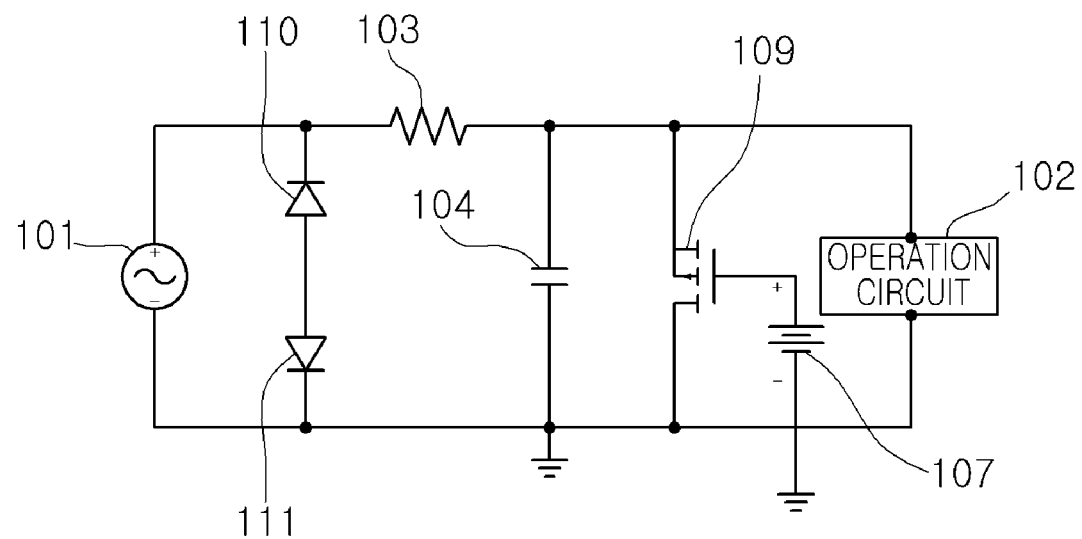
FIGS. 7A and 7B are circuit diagrams illustrating a fifth modification of the EMI filter according to the first and second embodiments of the present invention, respectively.
Figure 7B:
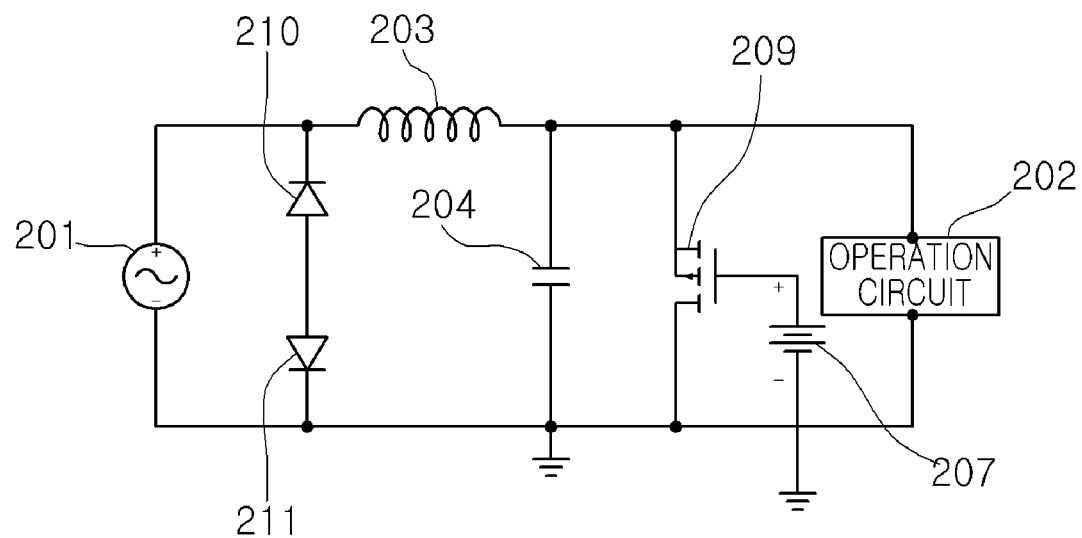

FIGS. 7A and 7B are circuit diagrams illustrating a fifth modification of the EMI filter according to the first and second embodiments of the present invention. In FIGS. 7A and 7B, a surge protection EMI filter is provided, in which one variable MOS capacitor is connected to the EMI filter instead of two diodes, according to the first and second embodiments. And an ESD protection circuit is further applied to the EMI filter. The connection of the variable MOS capacitor instead of the diodes can prevent a change in the breakdown voltage of the diodes that occurs when a voltage is applied to the diodes.

Referring to FIG. 7A, a resistor 103 is connected in series between an input terminal and an output terminal of the EMI filter, for example, between a first power source 101 and an operation circuit 102. And a capacitor 104 is connected in parallel therebetween. Further, a variable MOS capacitor 109 is connected in parallel between the first power source 101 and the operation circuit 102. Further, a second power source 107 is connected to a gate terminal of the MOS capacitor 109. Here, the first power source 101 is an alternating current (AC) power source, and a second power source 107 is a direct current (DC) power supply. Further, third and fourth diodes 110 and 111 are connected in parallel between the first power source 101 and the resistor 103, and the third and fourth diodes 110 and 111 are connected back-to-back.

Referring to FIG. 7B, an inductor 203 is connected in series between an input terminal and an output terminal of the EMI filter, for example, between a first power source 201 and an operation circuit 202. And a capacitor 204 is connected in parallel therebetween. Further, a variable MOS capacitor 209 is connected in parallel between the first power source 201 and the operation circuit 202. Further, a second power source 207 is connected to a gate terminal of the MOS capacitor 209. Here, the first power source 201 is an alternating current (AC) power source, and the second power source 207 is a direct current (DC) power source. Further, third and fourth diodes 210 and 211 are connected in parallel between the first power source 201 and the inductor 203, and the third and fourth diodes 210 and 211 are connected back-to-back.

Figure 8A:
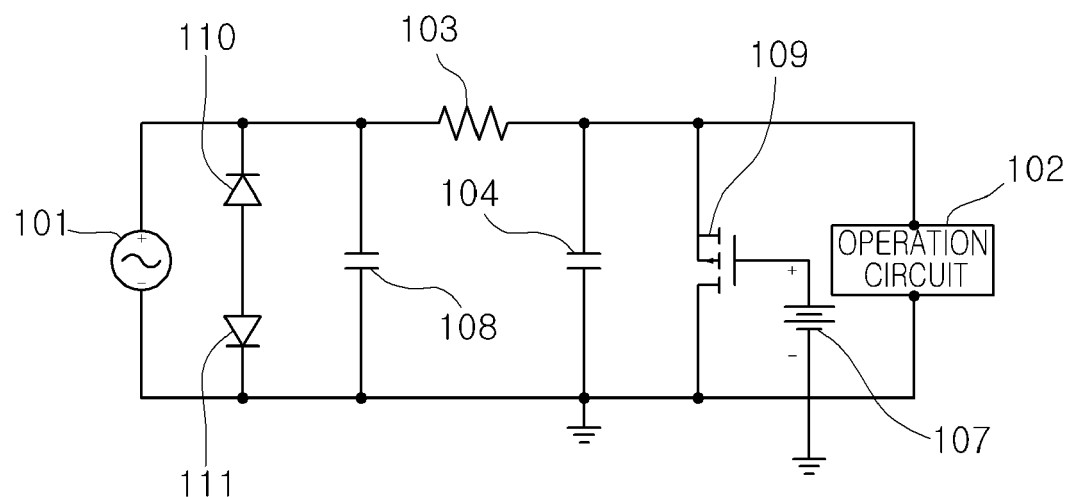
FIGS. 8A and 8B are circuit diagrams illustrating a sixth modification of the EMI filter according to the first and second embodiments of the present invention, respectively.
Figure 8B:
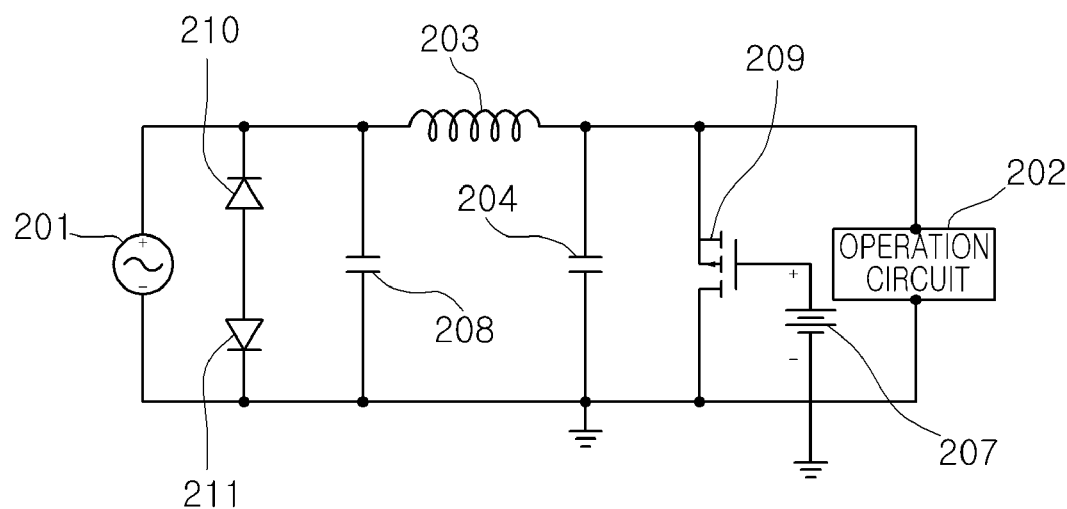

FIGS. 8A and 8B are circuit diagrams illustrating a sixth modification of the EMI filter according to the first and second embodiments of the present invention. In FIGS. 8A and 8B, a surge protection EMI filter is provided, in which one capacitor is additionally connected to the surge protection EMI filter according to the fifth modification described with reference to FIGS. 7A and 7B.

Referring to FIG. 8A, a resistor 103 is connected in series between an input terminal and an output terminal of the EMI filter, for example, between a first power source 101 and an operation circuit 102. And first and second capacitors 104 and 108 are connected in parallel therebetween. Here, the first capacitor 104 is connected in parallel between the resistor 103 and the operation circuit 102, and the second capacitor 108 is connected in parallel between the first power source 101 and the resistor 103. Further, a variable MOS capacitor 109 is connected in parallel between the first power source 101 and the operation circuit 102. Further, a second power source 107 is connected to the MOS capacitor 109. Here, the first power source 101 is an alternating current (AC) power source, and the second power source 107 is a direct current (DC) power source. Further, third and fourth diodes 110 and 111 are connected in parallel between the first power source 101 and the resistor 103, and the third and fourth diodes 110 and 111 are connected back-to-back.

Referring to FIG. 8B, an inductor 203 is connected in series between an input terminal and an output terminal of the EMI filter, for example, between a first power source 201 and an operation circuit 202. And first and second capacitors 204 and 208 are connected in parallel therebetween. Here, the first capacitor 204 is connected in parallel between the inductor 203 and the operation circuit 202, and the second capacitor 208 is connected in parallel between the first power source 201 and the inductor 203. Further, a variable MOS capacitor 209 is connected in parallel between the first power source 201 and the operation circuit 202. A second power source 207 is connected to the MOS capacitor 209. Here, the first power source 201 is an alternating current (AC) power source, and the second power source 207 is a direct current (DC) power source. Further, third and fourth diodes 210 and 211 are connected in parallel between the first power source 201 and the inductor 203, and the third and fourth diodes 210 and 211 are connected back-to-back.

As described above, the EMI filter capable of controlling a cutoff frequency or the ESD protection circuit, which is implemented with the EMI filter, may be formed of discrete passive elements or integrated into one die. At this time, an LTCC (Low Temperature Co-firing Ceramics) process that use a ceramic process or an integrated device process that uses a semiconductor process may be used as an integration process.

Further, an array that includes a plurality of EMI filters or ESD protection circuits may be formed on one die. That is, the EMI circuit is integrated into a silicon wafer by using a semiconductor process, and a plurality of EMI circuits may be disposed in one die. In this way, by using one die, more EMI filters, ESD protection circuits or composite devices thereof can be realized at low costs.

Further, in the embodiments, the method in which the capacitance is controlled so as to control the cutoff frequency has been described, but the present invention is not limited thereto. Even when an EMI filter is implemented by using any discrete element that is capable of controlling resistance or inductance, it is also possible to control the cutoff frequency in the same manner as described above.

As described above, the cutoff frequency can be freely controlled by enabling control of resistance or inductance as well as capacitance of an EMI filter, which includes at least one of a resistor, a capacitor, an inductor and a combination thereof. Therefore, even when the EMI filter is not manufactured according to the cutoff frequency, it is possible to freely control the cutoff frequency. Further, since the EMI filter according to the embodiment of the invention can be applied to a surge protection device, which includes an ESD protection function as well as an EMI filter, the process can be simplified and costs can be reduced. Further, reliability of the element can be increased.

Although the invention has been described with reference to the accompanying drawings and the preferred embodiments, the invention is not limited thereto, but is defined by the appended claims. Therefore, it should be noted that various changes and modifications can be made by those skilled in the art without departing from the technical spirit of the appended claims.

What is claimed is:

1. An EMI filter comprising:
   input and output terminals;
   a resistor coupled in series between the input terminal and the output terminal;
   a capacitor coupled in parallel between the input terminal and the output terminal;
   a capacitance control unit, the capacitance control unit is coupled in parallel between the input terminal and the output terminal and the capacitor; and
   an electrostatic discharge (ESD) protection circuit that is provided between the input terminal and the output terminal.

2. The EMI filter of claim 1, wherein the capacitance control unit comprises:
   a diode unit coupled in parallel between the input terminal and the output terminal; and
   a voltage source coupled to the diode unit, the voltage source applies a reverse voltage to the diode unit,
      wherein a junction capacitance of the diode unit changes according to the voltage applied by the voltage source.

3. The EMI filter of claim 2, wherein the diode unit comprises at least two diodes coupled back-to-back.

4. The EMI filter of claim 1, wherein the capacitance control unit comprises:
   a MOS capacitor coupled in parallel between the input terminal and the output terminal; and
   a voltage source that applies a voltage to a gate terminal of the MOS capacitor, wherein a junction capacitance of the MOS capacitor changes according to the voltage of the voltage source.

5. The EMI filter of claim 1, further comprising a second capacitor coupled in parallel between the input terminal and the output terminal, wherein the resistor is disposed between the capacitor and second capacitor.

6. The EMI filter of claim 1, wherein the ESD protection circuit includes an ESD diode unit coupled in parallel between the input terminal and the output terminal.

7. The EMI filter of claim 6, wherein the ESD diode unit comprises at least two ESD diodes coupled back-to-back.

8. An EMI filter comprising:
   input and output terminals;
   an inductor coupled in series between an input terminal and an output terminal;
   a capacitor coupled in parallel between the input terminal and the output terminal; and
   a capacitance control unit coupled in parallel between the input terminal and the output terminal and the capacitor; and
   an ESD protection circuit that is provided between the input terminal and the output terminal.

9. The EMI filter of claim 8, wherein the capacitance control unit comprises:
   a diode unit coupled in parallel between the input terminal and the output terminal; and
   a voltage source coupled to the diode unit, the voltage source applies a reverse voltage to the diode unit,
      wherein a junction capacitance of the diode unit changes according to the voltage applied by the voltage source.

10. The EMI filter of claim 9, wherein the diode unit comprises at least two diodes coupled back-to-back.

11. The EMI filter of claim 8, wherein the capacitance control unit comprises:
    a MOS capacitor coupled in parallel between the input terminal and the output terminal; and
    a voltage source that applies a voltage to a gate terminal of the MOS capacitor,
       wherein a junction capacitance of the MOS capacitor changes according to the voltage of the voltage source.

12. The EMI filter of claim 8, further comprising a second capacitor coupled in parallel between the input terminal and the output terminal, wherein the inductor is disposed between the capacitor and second capacitor.

13. The EMI filter of claim 8, wherein the ESD protection circuit includes an ESD diode unit coupled in parallel between the input terminal and the output terminal.

14. The EMI filter of claim 13, wherein the ESD diode unit comprises at least two ESD diodes coupled back-to-back.

15. An circuit comprising:
    input and output terminals;
    a passive element coupled in series with the input and output terminals;
    a capacitor coupled in parallel with the input and output terminals;
    a capacitance control unit coupled in parallel with the input and output terminals; and
    an ESD protection circuit that is provided between the input terminal and the output terminal.

16. The circuit of claim 15 wherein the passive element comprises a resistor or an inductor.

17. The circuit of claim 15 wherein the capacitance control unit comprises:
    a diode unit coupled in parallel between the input terminal and the output terminal; and
    a voltage source coupled to the diode unit, the voltage source applies a reverse voltage to the diode unit,
       wherein a junction capacitance of the diode unit changes according to the voltage applied by the voltage source.

18. The circuit of claim 15 wherein the capacitance control unit comprises:
    a MOS capacitor coupled in parallel between the input terminal and the output terminal; and
    a voltage source that applies a voltage to a gate terminal of the MOS capacitor, wherein a junction capacitance of the MOS capacitor changes according to the voltage of the voltage source.

* * * * *